United States Patent
Tang et al.

(10) Patent No.: US 7,030,641 B1
(45) Date of Patent: Apr. 18, 2006

(54) PROGRAMMABLE FUSE STATE DETERMINATION SYSTEM AND METHOD

(75) Inventors: Andrew T. K. Tang, San Jose, CA (US); Trey Roessig, Fremont, CA (US); David Thomson, Fremont, CA (US); Jonathan Audy, Los Gatos, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/943,370

(22) Filed: Sep. 17, 2004

Related U.S. Application Data

(60) Provisional application No. 60/504,347, filed on Sep. 18, 2003.

(51) Int. Cl.
*G01R 31/26* (2006.01)
(52) U.S. Cl. ..................................... 324/765
(58) Field of Classification Search ................ 324/765, 324/763, 158.1; 365/201
See application file for complete search history.

(56) References Cited

U.S. PATENT DOCUMENTS 5,140,554 A * 8/1992 Schreck et al. .............. 365/201
6,496,028 B1 * 12/2002 Manhaeve et al. .......... 324/763

\* cited by examiner

*Primary Examiner*—Jermele Hollington
*Assistant Examiner*—Tung X. Nguyen
(74) *Attorney, Agent, or Firm*—Koppel, Jacobs, Patrick & Heybl

(57) ABSTRACT

A programmable fuse state determination system and method provide a fuse current through a programmed fuse which produces a voltage that varies with the fuse's resistance. The voltage is compared with a threshold voltage to indicate whether the fuse is blown or intact. The invention employs 'normal' and 'test' modes, in which the relationship between the fuse's resistance and the threshold voltage differ, such that a higher fuse resistance is required for the fuse to be determined blown in the 'test' mode than in the 'normal' mode.

12 Claims, 5 Drawing Sheets

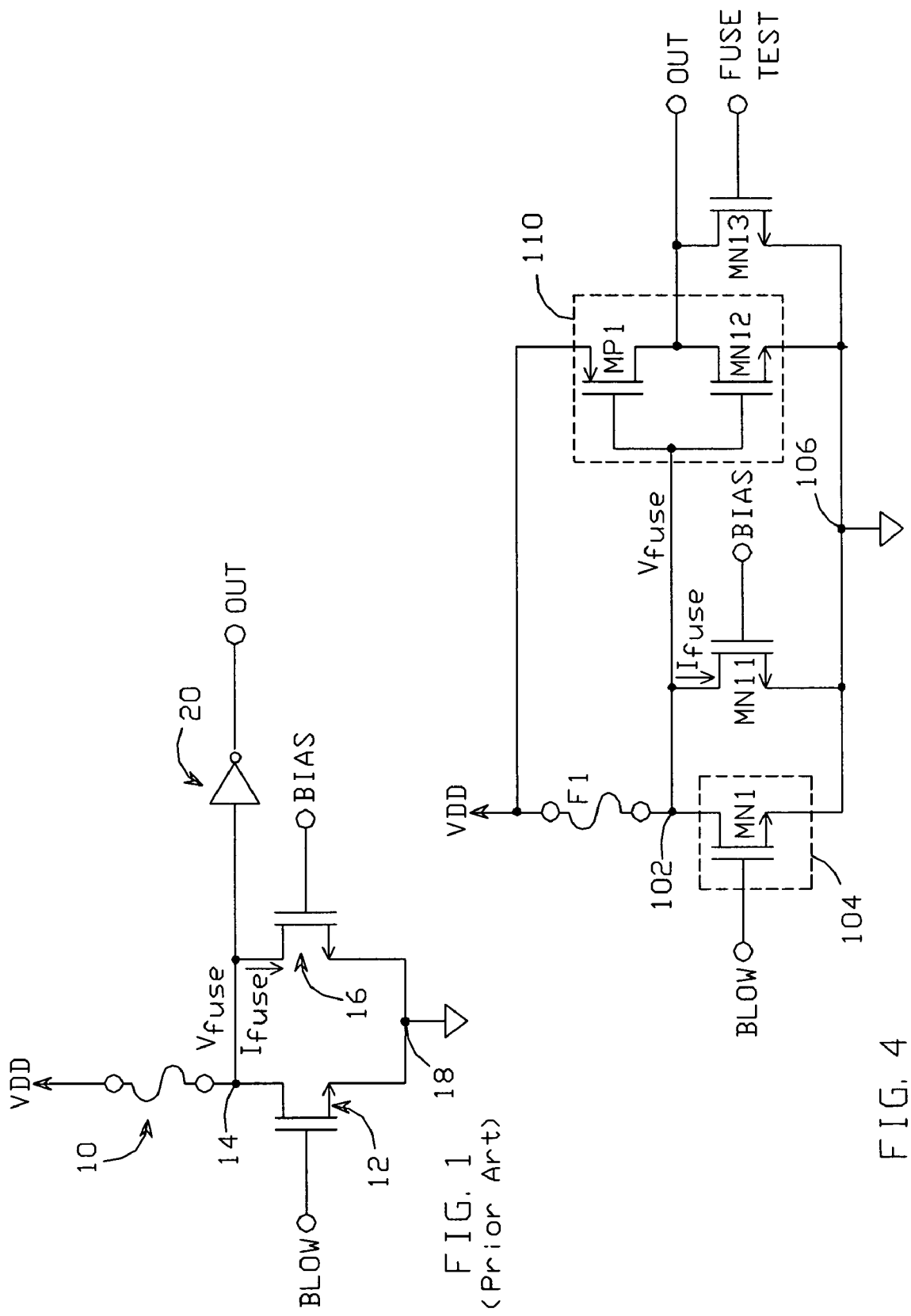

PROGRAMMABLE FUSE STATE DETERMINATION SYSTEM AND METHOD

This application claims the benefit of provisional patent application No. 60/504,347 to Tang et al., filed Sep. 18, 2003.

BACKGROUND OF THE INVENTION

1. Field of the Invention

This invention relates to the field of programmable fuses, and particularly to systems and methods for determining a programmable fuse's state.

2. Description of the Related Art

Programmable fuses are commonly used as non-volatile memory devices, with a blown fuse representing, for example, a logic '1', and an intact or unblown fuse representing a logic '0'. To determine whether a particular fuse is blown or intact, i.e., to determine its "state", a current is usually applied through the fuse. A voltage is developed due to the applied current flowing through the fuse's resistance; this voltage is compared with a predetermined threshold value to determine whether the fuse represents a '1' or a '0'.

A typical implementation using field-effect transistors (FETs) is shown in FIG. 1; bipolar transistors could also be used. A programmable fuse 10 is connected between a supply voltage VDD and the drain of a FET 12 at a node 14. In response to a BLOW command signal, FET 12 conducts a current sufficient to blow fuse 10. A second FET 16 is connected between node 14 and a circuit common point 18 (which can be ground or a non-zero voltage). In response to a bias voltage BIAS, FET 16 conducts a current $I_{fuse}$ through fuse 10, such that a voltage $V_{fuse}$ (=VDD−($I_{fuse}*R_{fuse}$)) is developed at node 14, where $R_{fuse}$ is the fuse's resistance. $V_{fuse}$ is applied to the input of an inverter 20 which has an associated "trip" voltage; the inverter output OUT is 'low' when $V_{fuse}$ is greater than the trip voltage (indicating that the fuse is intact), and is 'high' when $V_{fuse}$ is less than the trip voltage (indicating that the fuse is blown). The function of inverter 20 could alternatively be implemented with a comparator.

This method generates a voltage $V_{fuse}$ which decreases with the fuse's resistance, such that a fuse with a higher resistance is considered to be blown and a fuse with a lower resistance is considered to be intact. This method is reliable if a fuse's resistance is constant over its operational life. However, in some cases, fuse "regrowth" can occur if a fuse has not been blown properly, as can happen, for example, when different end-users use different equipment and/or conditions to blow the fuse. When this happens, the fuse's resistance can decrease significantly over its operational life. The fuse's apparent resistance can also vary due to changes or drift in the fuse state detection circuitry (e.g., FET 16, inverter 18, and voltage BIAS). These changes in resistance can cause the detected state of the fuse to change from blown to intact.

SUMMARY OF THE INVENTION

A programmable fuse state determination system and method are presented which overcome the problems noted above, by providing a fuse 'test' mode which reduces the probability of state detection errors that arise due to regrowth or circuit drift.

The present system and method provide a fuse current through a programmed fuse which produces a voltage at a first node that decreases with the fuse's resistance. The first node voltage is compared with a threshold voltage to produce an output that has a first state when the first node voltage is greater than the threshold voltage, and a second state when the first node voltage is less than the threshold voltage.

The invention creates two operational modes—a 'normal' mode and a 'test' mode—in which the relationship between the fuse resistance and the threshold voltage are different, such that a higher fuse resistance is required for the first node voltage to be less than the threshold voltage in 'test' mode than in 'normal' mode.

The use of a 'test' mode with different fuse state detection conditions serves to detect fuses that are marginally blown—i.e., the fuse may be detected as blown during 'normal' reading, but intact during 'test' mode. Due to regrowth or circuit drift, the detected state of such marginally blown fuses may change over time, thereby making it advantageous to identify such fuses as described herein.

Further features and advantages of the invention will be apparent to those skilled in the art from the following detailed description, taken together with the accompanying drawings.

BRIEF DESCRIPTION OF THE DRAWINGS

FIG. 1 is a schematic diagram of a known fuse state detection system.

FIG. 2b is a schematic diagram of a bias voltage generating circuit as might be used with the fuse state determination system shown in FIG. 2a.

FIG. 3b is a schematic diagram of a bias voltage generating circuit as might be used with the fuse state determination system shown in FIG. 3a.

FIG. 4 is a schematic diagram of another possible embodiment of a fuse state determination system per the present invention.

DETAILED DESCRIPTION OF THE INVENTION

The present invention provides a programmable fuse state detection means. A fuse's state is determined by comparing a voltage developed across the fuse (which decreases with the fuse's resistance) with a threshold voltage. The invention employs 'normal' and 'test' modes, with the 'test' mode establishing a different relationship between fuse resistance and threshold voltage than is present in 'normal' mode. Specifically, a higher fuse resistance is required for the developed voltage to be less than the threshold voltage in 'test' mode than in 'normal' mode, thereby providing a means of detecting fuses which are marginally blown.

Figure 2A:
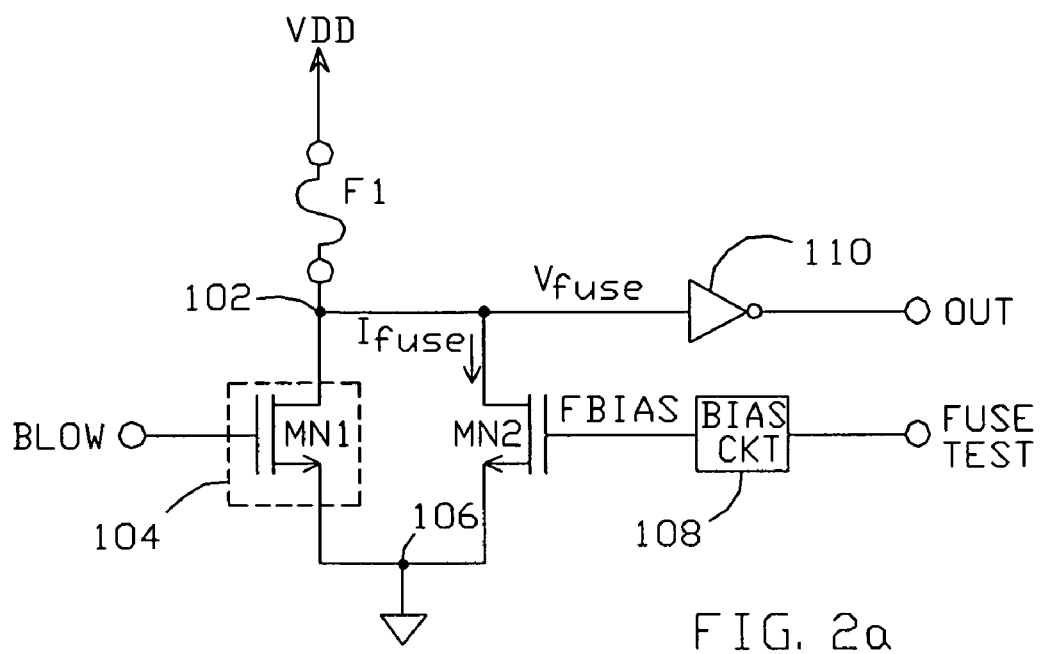
FIG. 2a is a schematic diagram of one possible embodiment of a fuse state determination system per the present invention.

There are numerous ways in which the relationship between fuse resistance and threshold voltage can be altered as required herein. One possible approach is illustrated in FIG. 2a. A programmable fuse F1 is connected between a supply voltage VDD and a node 102. A mechanism 104 for blowing the fuse, typically a FET MN1, is connected between node 102 and a circuit common point 106 (which may be ground or a non-zero voltage). In response to a command signal BLOW, MN1 conducts a current through F1 large enough to change its state from intact to blown.

Note that, though the present invention is shown and described as using FETs, bipolar transistors could also be used.

The state of F1 is detected by flowing a current through the fuse and comparing the resulting voltage $V_{fuse}$ with a threshold voltage. In FIG. 2a, the fuse current $I_{fuse}$ is provided by a FET MN2, which is connected between node 102 and circuit common. The fuse current conducted by MN2 varies with a bias voltage FBIAS applied to its gate; a bias circuit 108 provides FBIAS. A threshold detection circuit 110, typically an inverter, produces an output (OUT) having a first state when $V_{fuse}$ is greater than the threshold voltage, and having a second state when $V_{fuse}$ is less than the threshold voltage.

In this embodiment, the 'test' and 'normal' mode relationships between fuse resistance and threshold voltage are realized with two different FBIAS values—and thus two different magnitudes of fuse current $I_{fuse}$. The system is arranged such that the bias voltage produced by bias circuit 108 varies with a control signal FUSE TEST, such that circuit 108 produces a first FBIAS voltage and thus a first $I_{fuse}$ value $I_{fuse,1}$ when FUSE TEST is in a first state corresponding to 'normal' mode, and a second FBIAS value and thus a second $I_{fuse}$ value $I_{fuse,2}$ when FUSE TEST is in a second state corresponding to 'test' mode, with $I_{fuse,2} < I_{fuse,1}$. With a lower fuse current in 'test' mode, the resistance required for $V_{fuse}$ to be less than the threshold voltage is greater than it is for a higher fuse current.

Figure 2B:
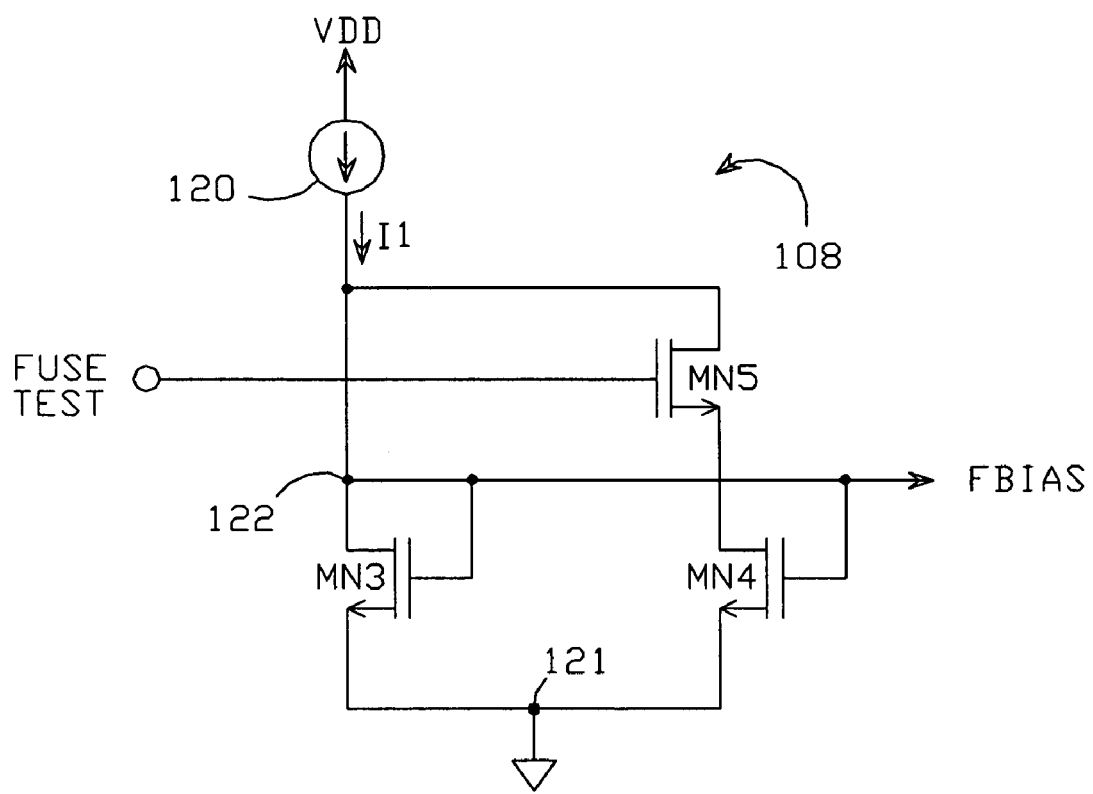

One possible embodiment of bias circuit 108 is shown in FIG. 2b. A current source 120 produces a current I1, which is delivered to a diode-connected FET MN3. MN3's source terminal is connected to a circuit common point 121, and its gate and drain terminals are connected to a node 122 that provides FBIAS. Another FET, MN4, has its gate connected to FBIAS node 122, its source connected to common point 121, and its drain connected to the output of current source 120 via a switching FET MN5, which is controlled with FUSE TEST. When FUSE TEST is in 'normal' mode, MN5 is off and MN3 mirrors I1 to MN2 of FIG. 2a. However, when FUSE TEST is in 'test' mode, MN5 and MN4 are on, such that both MN3 and MN4 mirror I1 to MN2.

A FET's "aspect ratio" (AR) is given by its width divided by its length. The relative aspect ratios ($AR_{MNx}$) of MN2, MN3 and MN4 establish the $I_{fuse,1}$ and $I_{fuse,2}$ values. When FUSE TEST is in 'normal' mode, MN3 and MN2 form a simple current mirror, and the fuse current $I_{fuse,1}$ is given by:

$I_{fuse,1} = I1(AR_{MN2}/AR_{MN3})$.

When FUSE TEST is in 'test' mode, MN5 is on, such that MN4 and MN3 share I1. Here, the fuse current $I_{fuse,2}$ is given by:

$I_{fuse,2} = I1[AR_{MN2}/AR_{MN3} + AR_{MN4})]$

For example, assume that MN2 and MN3 have aspect ratios of 3/6 (0.5), and MN4 has an aspect ratio of 9/6 (1.5). Then:

$I_{fuse,1} = I1(0.5/0.5) = I1$, and $I_{fuse,2} = I1[0.5/(0.5+1.5)] = I1/4$.

Thus, in this example, MN2 tries to sink a current with magnitude I1 during 'normal' fuse state detection mode, and a current with magnitude I1/4 during 'test' fuse state detection mode. In this way, the difference between the 'normal' and 'test' fuse currents is easily established, by selecting appropriate values for I1 and the aspect ratios.

Using a lower fuse current during 'test' mode has the effect of requiring a higher fuse resistance in order to develop a fuse voltage $V_{fuse}$ low enough to be less than the threshold voltage. For example, assume that, during 'normal' detection mode, with a fuse current of $I_{fuse,1}$, a fuse resistance of 1 M Ω is required for the fuse to be detected as "blown". By lowering the fuse current by a factor of 4 during 'test' mode as in the example above, with a fuse current of $I_{fuse,2}$, a fuse resistance of 4 MΩ is required for the fuse to be detected as "blown". A properly blown fuse having a resistance greater than 4 MΩ, would be detected as blown during both 'normal' and 'test' modes. However, a marginally blown fuse having a resistance between 1 and 4 M Ω would be detected as blown during 'normal' mode, but intact during 'test' mode. Thus, this technique provides a safety factor compared with normal fuse detection methods—the fuse resistance or detection circuit conditions would have to change by a factor of 4 (or any other chosen factor) before the fuse detection output would change state during normal reading. In this way, marginally blown fuses can be detected and appropriate action taken.

As noted above, the fuse currents are easily established by proper selection of I1 and the aspect ratios of MN2, MN3 and MN4. Selecting values to obtain a higher safety factor is beneficial in that the fuse cell output is less likely to change state over time, but a very large safety factor has the disadvantage of causing a higher proportion of programmed fuses to be rejected.

Note that the complexity of the fuse "cell", defined as fuse F1, FETs MN1 and MN2, and inverter 110, is not increased using this approach. As such, there is very little increase in required IC die area.

Figure 3A:
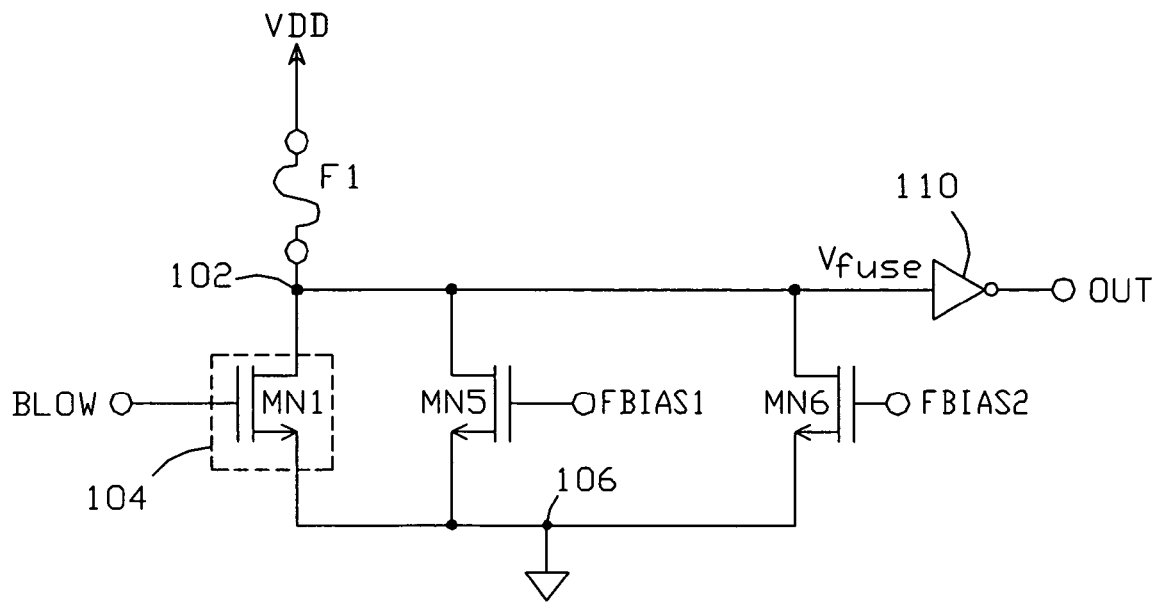
FIG. 3a is a schematic diagram of another possible embodiment of a fuse state determination system per the present invention.

Another possible embodiment of the present fuse state detection system is shown in FIG. 3a. Here, the 'normal' state detection fuse current $I_{fuse,1}$ is supplied by a first FET MN5 in response to a bias voltage FBIAS1; FET MN6 would be switched off by FBIAS2 when a current flows through FET MN5. The second, lower 'test' current $I_{fuse,2}$ is provided by a second FET MN6 in response to a bias voltage FBIAS2; FET MN5 would be switched off by FBIAS1 when a current flows through FET MN6. When so arranged, different 'test' and 'normal' fuse currents can be achieved by, for example, making FBIAS1≠FBIAS2, or by making the aspect ratio of MN5 larger than that of MN6.

Figure 3B:
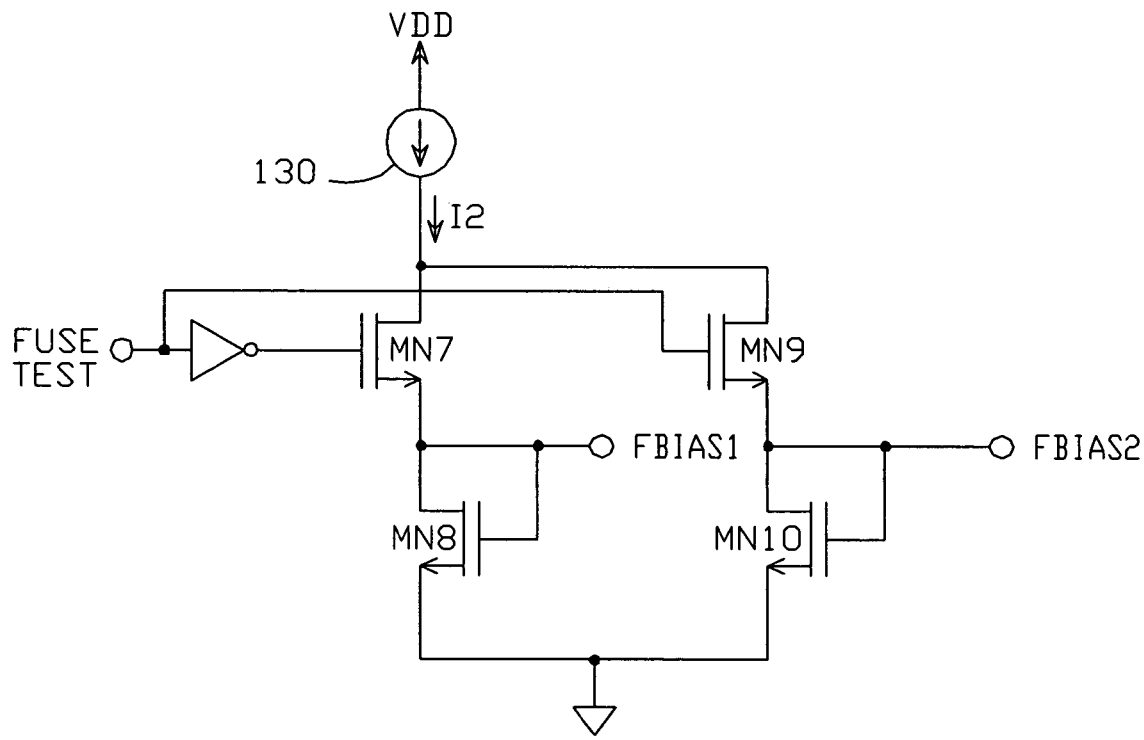

One possible embodiment of a circuit which provides FBIAS1 and FBIAS2 is shown in FIG. 3b. A current source 130 produces a current I2. When FUSE TEST is in 'normal' mode, a switching FET MN7 conducts I2 to a diode-connected FET MN8, such that FBIAS1 appears at MN8's gate and drain terminals and I2 is mirrored to MN5. When FUSE TEST is in 'test' mode, a switching FET MN9 conducts I2 to a diode-connected FET MN10, such that FBIAS2 appears at MN10's gate and drain terminals and I2 is mirrored to MN6. The relative aspect ratios of MN5, MN6, MN8 and MN10 determine the magnitudes of the 'normal' and 'test' fuse currents. For example, assume that MN5 and MN8 have aspect ratios of 3/6 (0.5), MN6 has an aspect ratio of 1/12 (0.0833) and MN10 has an aspect ratio of 10/12 (0.833). Then:

$I_{fuse,1} = I2(0.5/0.5) = I2$, and $I_{fuse,2} = I2[(0.0833/0.833) = I2/10$, thereby providing a safety factor of 10. As before, 'normal' and 'test' fuse currents are set to desired values via proper selection of I2 and the aspect ratios of the MN5, MN6, MN8 and MN10.

Another approach to establishing different relationships between fuse resistance and threshold voltage in 'normal' and 'test' modes is illustrated in FIG. 4. Here, rather than having 'normal' and 'test' fuse currents, there are 'normal' and 'test' trip points for the threshold detection circuit. A FET MN11 provides a fuse current $I_{fuse}$ in response to a bias voltage BIAS. $I_{fuse}$ causes a voltage $V_{fuse}$ to be developed at node 102, which is provided to threshold detection circuit 110. Here, circuit 110 is a conventional inverter comprising a P-type FET MP1 and an N-type FET MN12 connected in series between VDD and common point 106; the MP1 and MN12 gate terminals are connected together to provide the inverter's input, and their drain terminals are connected together to provide the inverter's output OUT. A FET MN13 is connected between OUT and common point 106, and is controlled by FUSE TEST.

MP1 and MN12 would typically be sized to provide a trip point $V_{trip1}$ which is approximately half of VDD. When FUSE TEST is 'low', MN13 is off and MP1/MN12 behave as a normal inverter. However, setting FUSE TEST 'high' turns on MN13, which lowers the trip point to $V_{trip2}$, where $V_{trip2} < V_{trip1}$.

This arrangement again aids in detecting marginally blown fuses. Suppose, for example, that a fuse is improperly blown, such that $V_{fuse}$ is just below $V_{trip1}$ when detecting the fuse state in 'normal' mode. Inverter output OUT would be 'high', indicating a properly blown fuse. However, during 'test' mode, with a lowered trip point, $V_{fuse}$ may be higher than $V_{trip2}$. Now the inverter output would be 'low', indicating that the fuse had not be blown properly. This difference in detected state between 'normal' and 'test' modes allows improperly blown fuses to be detected and rejected before they fail during use. Note that this approach requires more die area than does the design shown in FIG. 2a, due to the addition of a FUSE TEST FET to each fuse cell.

Figure 5A:
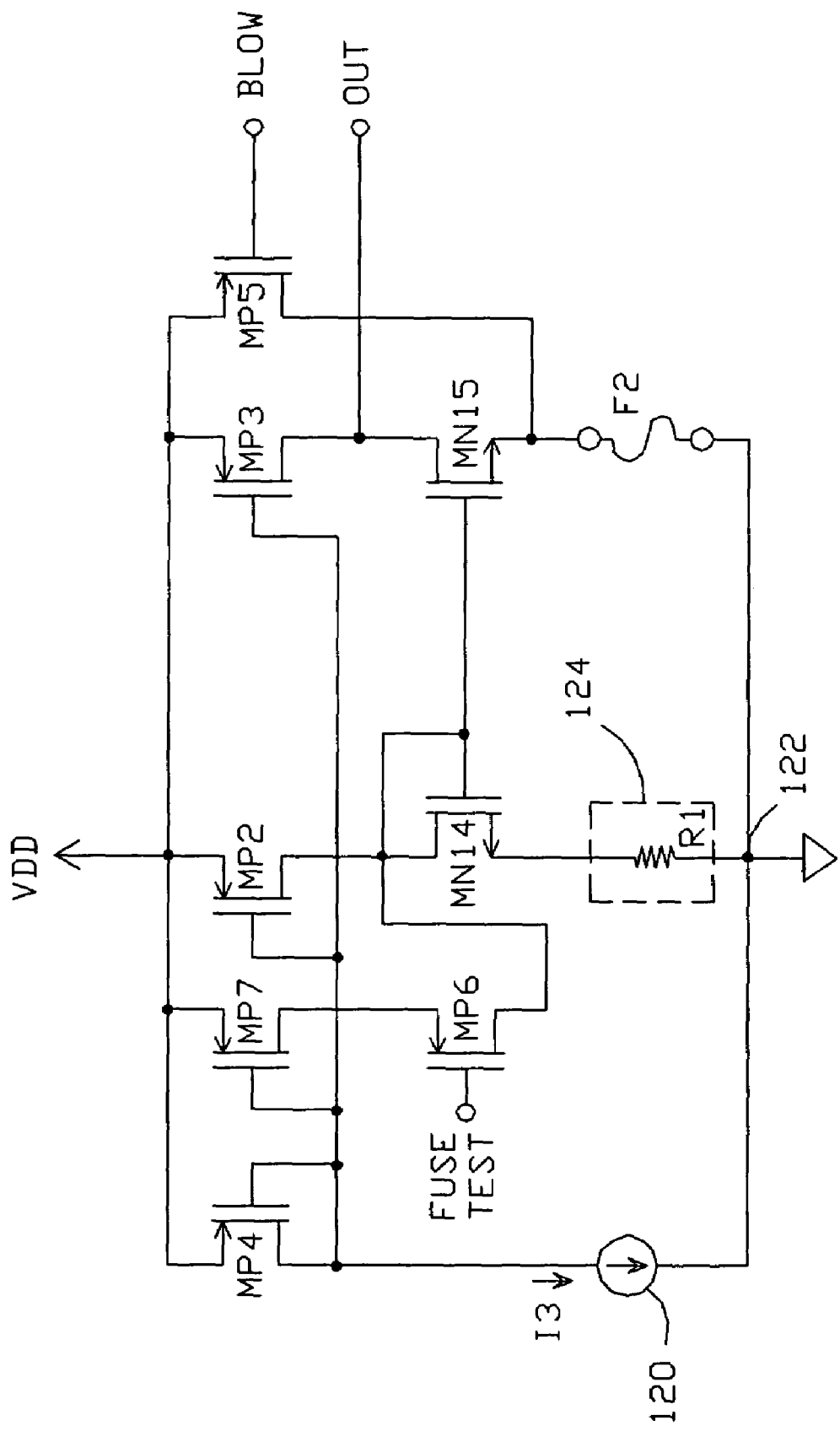
FIG. 5a is a schematic diagram of another possible embodiment of a fuse state determination system per the present invention.

Another possible embodiment of the present programmable fuse state determination system is shown in FIG. 5a. The sources of a diode-connected FET MN14 and a FET MN15 serve as the inverting and non-inverting inputs, respectively, to a source-fed amplifier. The drains of MN14 and MN15 are connected to FETs MP2 and MP3, respectively; the system's output OUT is taken at the junction of MN15 and MP3. A current source 120 conducts a current I3 through a diode-connected FET MP4, which gets mirrored to MN14 via MP2, and to MN15 via MP3. A programmable fuse F2 having a resistance $R_{fuse}$ is connected between the source of MN15 and a circuit common point 122, and a resistance 124 having a resistance value R1 is connected between the source of MN14 and circuit common point 122. Fuse F2 is blown using a FET MP5 connected between VDD and F2, which provides a current sufficient to blow F2 in response to a command signal BLOW.

Assume that MP2 and MP3 provide equal currents and that the aspect ratios of MN14 and MN15 are equal and are larger than those of MP2 and MP3. Resistance R1 establishes a threshold value for 'normal' mode operation, such that F2 is considered blown if $R_{fuse} > R1$, and intact if $R_{fuse} < R1$. The amplifier's differential input voltage VIN is given by: VIN=(voltage at the source of MN15)−(the voltage at the source of MN14). The amplifier is balanced when VIN=0, which occurs when $I3*R1=I3*R_{fuse}$ and $R1=R_{fuse}$. If $R_{fuse} > R1$ (indicating the F2 is blown), VIN will be greater than 0, the pull-down from MN15 will be weaker than the pull-up from MP3, and OUT will be pulled 'high'. If $R_{fuse} < R1$ (indicating that F2 is intact or only partially blown), VIN is less than 0, the pull-down from MN15 will be stronger than the pull-up from MP3, and OUT is pulled 'low'. However, if $R_{fuse}$ is close to R1, the OUT node is in danger of changing state over time due to changes in temperature, fuse regrowth, or circuit drift.

To avoid this, the system includes FETs MP6 and MP7. MP6 is connected to conduct a current to the drain of MN14 in response to a low-going FUSE TEST signal. MP7 is connected to provide the current conducted to MN14 when MP6 is on. In this example, MP7 is sized the same as MP2 and MP3 and is connected to mirror the I3 current to MP6, such that it conducts a current equal to that conducted by MP2 and MP3.

When FUSE TEST is 'high', MP6 is off and the system operates in 'normal' mode. When FUSE TEST is pulled low, the current through resistance 124 is the current from both MP2 and MP7/MP6 (=2*I3 assuming 1:1 ratios between MP4:MP7 and MP4:MP2). The current through MP3 and MN15 remains the same as during 'normal' mode. In 'test mode' (i.e., when FUSE TEST is pulled low), the amplifier is balanced when $2*I3*R1=I3*R_{fuse}$ and $2*R1=R_{fuse}$. Thus, OUT is 'high' when $R_{fuse} > 2*R1$ (indicating that F2 is blown) and is 'low' when $R_{fuse} < 2*R1$ (indicating that F2 is intact). A marginally blown fuse (with R1 close to $R_{fuse}$) will not pass the 'test' mode, and a fuse that passes the 'test' mode will have a safety factor of 2 during 'normal' mode. The safety factor can be set to a desired value by properly selecting the aspect ratios of MP7 and MP6 to set the current into resistance 124 during 'test' mode.

Figure 5B:
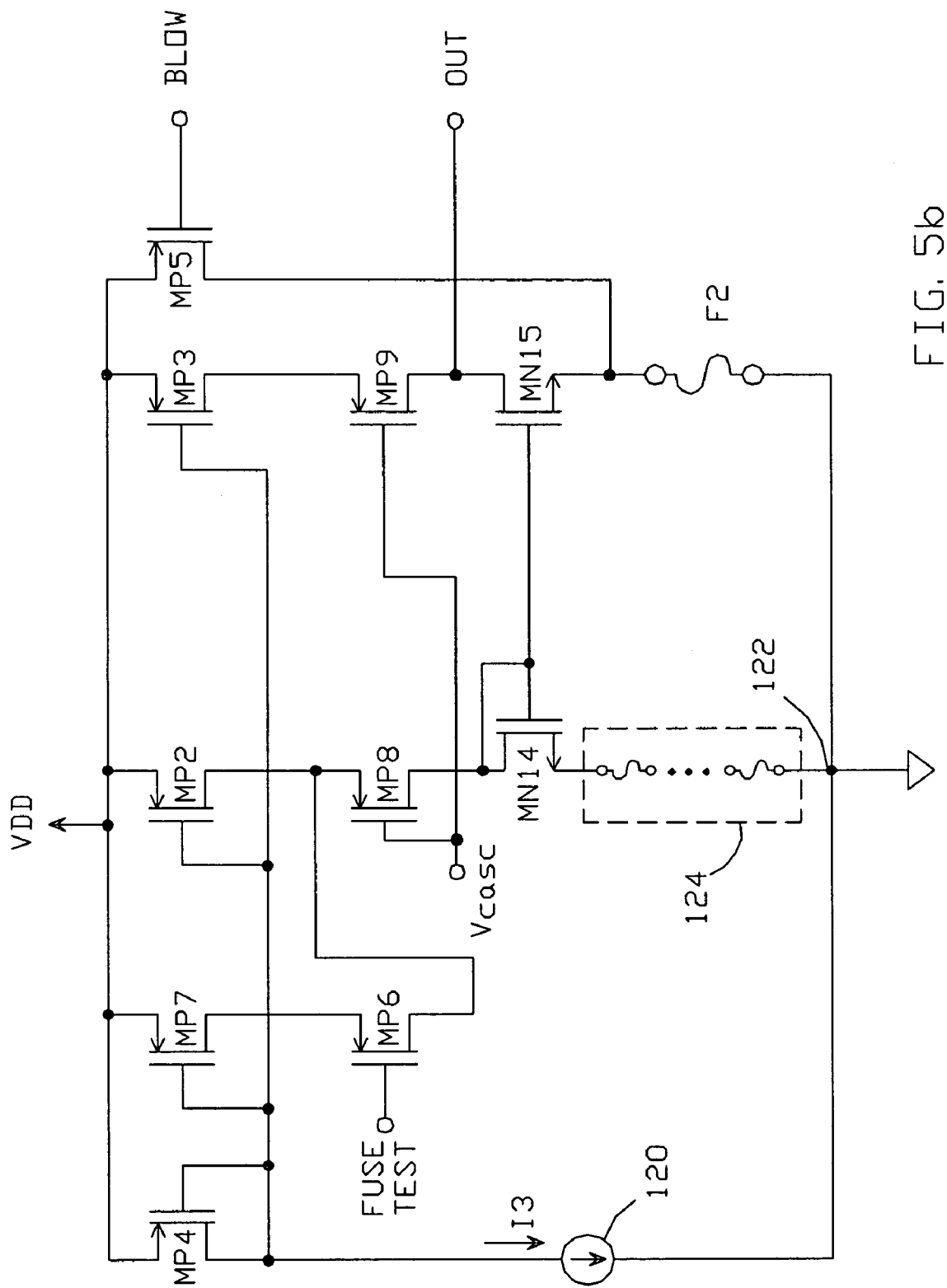
FIG. 5b is a schematic diagram of another possible embodiment of a fuse state determination system per the present invention.

A preferred embodiment of the approach illustrated in FIG. 5a is shown in FIG. 5b. Here, resistance 124 is implemented with several intact fuses connected in series to give a resistance that is significantly larger than that of a single intact fuse, but significantly smaller than a blown fuse. This embodiment also includes a pair of cascode FETs MN8 and MP9 which increase the amplifier gain: MP8 is connected between MP2 and MN14, and MP9 is connected between MP3 and MN15. A bias voltage $V_{casc}$ is connected to the gates of cascode FETs MN8 and MP9, and is selected such that MP2 and MP3 are biased to operate in the saturation region. Operation of the programmable fuse state determination system is otherwise identical to that shown in FIG. 5a. Note that FET MP6 could alternately be implemented with an N-type FET, in which case FUSE TEST would be pulled 'low' for 'normal' reading, and pulled 'high' to enter 'test' mode.

Note that the circuit implementations shown in FIGS. 2a, 2b, 3a, 3b, 4, 5a and 5b are merely exemplary; there are numerous ways in which the method of the present invention could be implemented. Is it only necessary that the programmable fuse state determination system use a 'test' mode with more stringent comparison conditions for detecting blown fuses than are used when in its 'normal' mode.

While particular embodiments of the invention have been shown and described, numerous variations and alternate embodiments will occur to those skilled in the art. Accordingly, it is intended that the invention be limited only in terms of the appended claims.

We claim:

1. A programmable fuse state determination system, comprising:
    a programmable fuse;
    a current source arranged to provide a fuse current through said fuse which produces a voltage at a first node that varies with the resistance of said fuse;

a threshold detection circuit which produces an output having a first state when said first node voltage is greater than a threshold voltage and having a second state when said first node voltage is less than said threshold voltage, one of said states indicating that said fuse is blown and the other of said states indicating that said fuse is intact; and a test circuit which has 'normal' and 'test' modes, said test circuit arranged to establish a first relationship between the resistance of said fuse and said threshold voltage when in said 'normal' mode and to establish a second, different relationship between the resistance of said fuse and said threshold voltage when in said 'test' mode, such that a higher fuse resistance is required for said threshold detection circuit output to indicate that said fuse is blown in said 'test' mode than in said 'normal' mode;

wherein said current source comprises a first transistor (Q1) having its current circuit connected between said first node and a circuit common point and which conducts said fuse current in response to a bias voltage applied to Q1's control input, said test circuit comprising:

a 'fuse test' input for receiving a 'fuse test' signal which has a 'normal' state corresponding to said 'normal' mode and a 'test' state corresponding to said 'test' mode; and an output which provides said bias voltage to Q1, said test circuit arranged to provide a first bias voltage when said fuse test signal is in said normal state such the fuse current conducted by Q1 has a first value $I_{fuse,1}$, and to provide a second bias voltage when said fuse test signal is in said test state such that the fuse current conducted by Q1 has a second value $I_{fuse,2}$, said test circuit arranged such that $I_{fuse,1} > I_{fuse,2}$.

2. The system of claim 1, wherein said test circuit further comprises:

a second current source which outputs a current I1;

a diode-connected transistor (Q2) connected to said second current source at a second node and which conducts at least a portion of said current I1 between said second node and a second circuit common point;

a switching transistor having its control input connected to receive said fuse test signal and its current circuit connected between said second node and a third node such that said switching transistor is off when said fuse test signal is in said 'normal' state and is on when said fuse test signal is in said 'test' state; and a third transistor (Q3) having its control input connected to said second node and its current circuit connected between said third node and said second circuit common point, such that said switching transistor and Q3 divert a portion of I1 away from said second node when said fuse test signal is in said test state, said bias voltage provided at second node.

3. The system of claim 2, wherein Q1, Q2, and Q3 are field-effect transistors (FETs), each of which has a respective aspect ratio ($AR_{Qx}$) given by its channel width/channel length, wherein said current $I_{fuse,1}$ is given by:

$$I1\left(\frac{AR_{Q1}}{AR_{Q2}}\right)$$

and said current $I_{fuse,2}$ is given by:

$$I1\left(\frac{AR_{Q1}}{AR_{Q2}+AR_{Q3}}\right).$$

4. A programmable fuse state determination system, comprising:

a programmable fuse;

a current source arranged to provide a fuse current through said fuse which produces a voltage at a first node that varies with the resistance of said fuse;

a threshold detection circuit which produces an output having a first state when said first node voltage is greater than a threshold voltage and having a second state when said first node voltage is less than said threshold voltage, one of said states indicating that said fuse is blown and the other of said states indicating that said fuse is intact; and a test circuit which has 'normal' and 'test' modes, said test circuit arranged to establish a first relationship between the resistance of said fuse and said threshold voltage when in said 'normal' mode and to establish a second, different relationship between the resistance of said fuse and said threshold voltage when in said 'test' mode, such that a higher fuse resistance is required for said threshold detection circuit output to indicate that said fuse is blown in said 'test' mode than in said 'normal' mode;

wherein said current source comprises a first transistor (Q1) having its current circuit connected between said first node and a circuit common point and which conducts said fuse current in response to a first bias voltage applied to Q1's control input, said test circuit comprising:

a second transistor (Q2) having its current circuit connected between said first node and said circuit common point and which conducts said fuse current in response to a second bias voltage applied to Q2's control input;

a 'fuse test' input for receiving a 'fuse test' signal which has a 'normal' state corresponding to said 'normal' mode and a 'test' state corresponding to said 'test' mode;

a first output which provides said first bias voltage to Q1; and a second output which provides said second bias voltage to Q2;

said circuit arranged to provide said first bias voltage when said fuse test signal is in said 'normal' state such that Q1 conducts a fuse current having a value $I_{fuse,1}$, and to provide said second bias voltage when said fuse test signal is in said 'test' state such that Q2 conducts a fuse current having a value $I_{fuse,2}$, said circuit arranged such that $I_{fuse,1} > I_{fuse,2}$.

5. The system of claim 4, wherein said test circuit further comprises:

a second current source which outputs a current I1;

first and second switching transistors having their respective control inputs connected such that said first switching transistor is on and said second switching transistor is off when said fuse test signal is in said 'normal' state and such that said second switching transistor is on and said first switching transistor is off when said fuse test signal is in said 'test' state, the current circuit of said first switching transistor connected between said second current source and a second node and the current circuit of said second switching transistor connected between said second current source and a third node;

a diode-connected transistor (Q3) connected between said second node and a second circuit common point such that Q3 conducts current I1 when said first switching transistor is on; and a diode-connected transistor (Q4) connected between said third node and said second circuit common point such that Q4 conducts current I1 when said second switching transistor is on;

said first bias voltage provided at said second node and said second bias voltage provided at said third node.

6. The system of claim 5, wherein said Q1, Q2, Q3 and Q4 are field-effect transistors (FETs), each of which has a respective aspect ratio ($AR_{Qx}$) given by its channel width/channel length, wherein said current $I_{fuse,1}$ is given by:

$$I1\left(\frac{AR_{Q1}}{AR_{Q3}}\right)$$

and said current $I_{fuse,2}$ is given by:

$$I1\left(\frac{AR_{Q2}}{AR_{Q4}}\right).$$

7. A programmable fuse state determination system, comprising:

a programmable fuse;

a current source arranged to provide a fuse current through said fuse which produces a voltage at a first node that varies with the resistance of said fuse;

a threshold detection circuit which produces an output having a first state when said first node voltage is greater than a threshold voltage and having a second state when said first node voltage is less than said threshold voltage, one of said states indicating that said fuse is blown and the other of said states indicating that said fuse is intact; and a test circuit which has 'normal' and 'test' modes, said test circuit arranged to establish a first relationship between the resistance of said fuse and said threshold voltage when in said 'normal' mode and to establish a second, different relationship between the resistance of said fuse and said threshold voltage when in said 'test' mode, such that a higher fuse resistance is required for said threshold detection circuit output to indicate that said fuse is blown in said 'test' mode than in said 'normal' mode;

wherein said threshold detection circuit comprises an inverter, said inverter comprising:

a first transistor (Q1); and a second transistor (Q2) complementary to said first transistor, the current circuits of Q1 and Q2 connected together at a second node between a supply voltage and a circuit common point, the control inputs of Q1 and Q2 connected to said first node, said second node being said threshold detection circuit output;

said test circuit comprising:

a 'fuse test' input for receiving a 'fuse test' signal which has a 'normal' state corresponding to said 'normal' mode and a 'test' state corresponding to said 'test' mode; and a third transistor (Q3) having its control input connected to said fuse test input and its current circuit connected between said second node and said circuit common point such that said threshold voltage is equal to a first threshold voltage ($V_{T1}$) when said fuse test signal is in its 'normal' state and is equal to a second threshold voltage ($V_{T2}$) when said fuse test signal is in its 'test' state, wherein $V_{T2}<V_{T1}$.

8. A programmable fuse state determination system, comprising:

a programmable fuse;

a first transistor (Q1) having its current circuit connected between said fuse and a circuit common point and which conducts a fuse current through said fuse in response to a bias voltage applied to Q1's control input, Q1 and said fuse connected together at a first node, said fuse current producing a voltage at said first node that decreases with the resistance of said fuse;

a threshold detection circuit which produces an output having a first state when said first node voltage is greater than a threshold voltage and a second state when said first node voltage is less than said threshold voltage;

a 'fuse test' input for receiving a 'fuse test' signal which has a 'normal' state and a 'test' state; and a test circuit which provides said bias voltage to Q1, said circuit arranged to provide a first bias voltage when said fuse test signal is in said 'normal' state such the fuse current conducted by Q1 has a first value $I_{fuse,1}$, and to provide a second bias voltage when said fuse test signal is in said 'test' state such that the fuse current conducted by Q1 has a second value $I_{fuse,2}$, said circuit arranged such that $I_{fuse,1}>I_{fuse,2}$, said test circuit comprising:

a current source which outputs a current I1;

a diode-connected transistor (Q2) connected to said current source at a second node and which conducts at least a portion of said current I1 between said second node and a second circuit common point;

a switching transistor having its control input connected to receive said fuse test signal and its current circuit connected between said second node and a third node such that said switching transistor is off when said fuse test signal is in said 'normal' state and is on when said fuse test signal is in said 'test' state; and a third transistor (Q3) having its control input connected to said second node and its current circuit connected between said third node and said second circuit common point, such that said switching transistor and Q3 divert a portion of I1 away from said second node when said fuse test signal is in said 'test' state;

said bias voltage provided at said second node;

such that a higher fuse resistance is required for said first node voltage to be less than said threshold voltage when said fuse test signal is in said 'test' state than when it is in said 'normal' state.

9. The system of claim 8, wherein Q1, Q2, and Q3 are field-effect transistors (FETs), each of which has a respective aspect ratio ($AR_{Qx}$) given by its channel width/channel length, wherein said current $I_{fuse,1}$ is given by:

$$I1\left(\frac{AR_{Q1}}{AR_{Q2}}\right)$$

and said current $I_{fuse,2}$ is given by:

$$I1\left(\frac{AR_{Q1}}{AR_{Q2}+AR_{Q3}}\right).$$

10. A method of determining the state of a programmable fuse, comprising:

causing a current to flow through said fuse to generate a voltage that decreases with the resistance of said fuse;

comparing said generated voltage with a predetermined threshold voltage;

producing an output having a first state when said generated voltage is greater than said threshold voltage and having a second state when said generated voltage is less than said threshold voltage, one of said states indicating that said fuse is blown and the other of said states indicating that said fuse is intact;

establishing a 'normal mode' in which there is a first relationship between the resistance of said fuse and said threshold voltage;

establishing a 'test mode' in which there is a second, different relationship between the resistance of said fuse and said threshold voltage;

such that a higher fuse resistance is required to produce an output indicating that said fuse is blown in said 'test' mode than in said 'normal' mode; and initiating said test mode to determine the state of said programmable fuse.

11. The method of claim 10, wherein said step of establishing a 'normal' mode comprises causing a first current to flow through said fuse and said step of establishing a 'test' mode comprises causing a second current to flow through said fuse, said second current being less than said first current.

12. The method of claim 10, wherein said step of establishing a 'normal' mode comprises defining a first threshold voltage with which said generated voltage is compared and said step of establishing a 'test' mode comprises defining a second threshold voltage with which said generated voltage is compared, said second threshold voltage being less than said first threshold voltage.

* * * * *